(12) United States Patent
Tang

(10) Patent No.: US 8,750,194 B2
(45) Date of Patent: *Jun. 10, 2014

(54) INTERLEAVER ADDRESS GENERATION IN TURBO DECODERS FOR WIRELESS COMMUNICATION SYSTEMS

(75) Inventor: Jun Tang, Lake Forest, CA (US)

(73) Assignee: Newport Media, Inc., Lake Forest, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/300,817

(22) Filed: Nov. 21, 2011

(65) Prior Publication Data

US 2012/0063380 A1    Mar. 15, 2012

Related U.S. Application Data

(62) Division of application No. 12/179,599, filed on Jul. 25, 2008, now Pat. No. 8,102,791.

(51) Int. Cl.
*H04J 11/00* (2006.01)
(52) U.S. Cl.
USPC ......................................................... 370/312

(58) Field of Classification Search
None
See application file for complete search history.

(56) References Cited

U.S. PATENT DOCUMENTS

2006/0256708 A1    11/2006 Wang et al.

*Primary Examiner* — Jae Y Lee
*Assistant Examiner* — Alan Lindenbaum
(74) *Attorney, Agent, or Firm* — Rahman LLC

(57) ABSTRACT

Address generation for interleaving in a wireless communication system includes at least one input generation module to generate at least one input signal. A first address generator module and a second address generator module generate a first output address for interleaving and a second output address for interleaving. A selector module selects an address for interleaving from the first and the second output address based on predetermined criteria. At least one input translation module is receives an input signal and translate the received input signal to generate a nominal input signal based on a value of the received input signal. An address generation module generates an address for interleaving based on the nominal input signal.

6 Claims, 9 Drawing Sheets

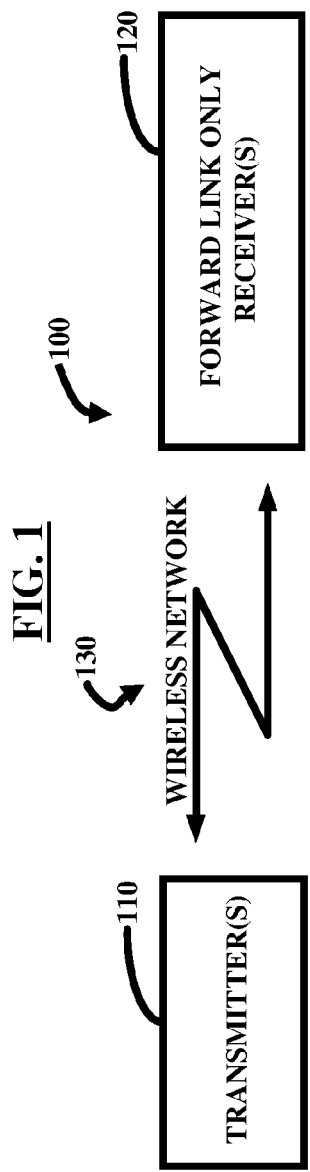
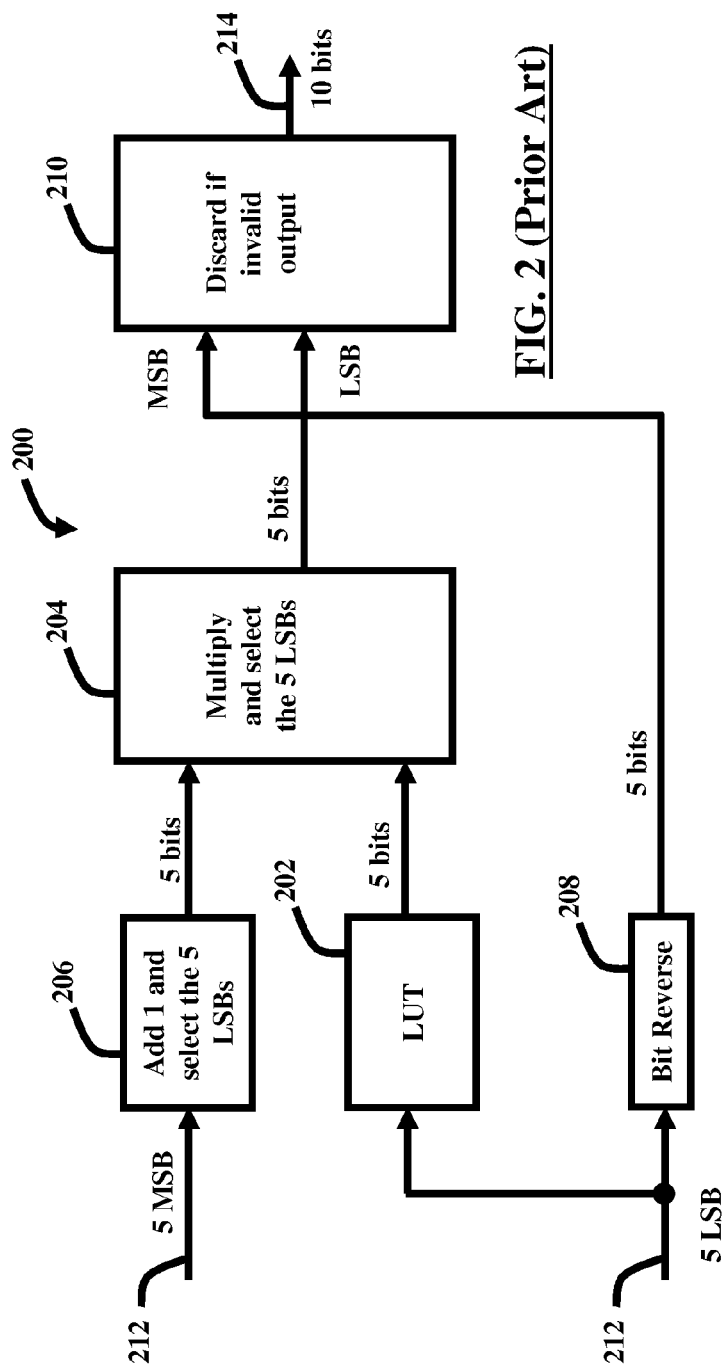
FIG. 1
FIG. 2 (Prior Art)

| | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|
| 0 | 31 | 62 | 93 | 124 | 156 | 187 | 218 | 249 | 280 | 311 | 342 | 373 | 404 | 435 | 466 | 497 | 528 | 559 | 590 | 621 | 652 | 683 | 714 | 745 | 776 | 807 | 838 | 869 | 900 | 931 | 962 |
| 1 | 32 | 63 | 94 | 125 | 157 | 188 | 219 | 250 | 281 | 312 | 343 | 374 | 405 | 436 | 467 | 498 | 529 | 560 | 591 | 622 | 653 | 684 | 715 | 746 | 777 | 808 | 839 | 870 | 901 | 932 | 963 |
| 2 | 33 | 64 | 95 | 126 | 158 | 189 | 220 | 251 | 282 | 313 | 344 | 375 | 406 | 437 | 468 | 499 | 530 | 561 | 592 | 623 | 654 | 685 | 716 | 747 | 778 | 809 | 840 | 871 | 902 | 933 | 964 |
| 3 | 34 | 65 | 96 | 127 | 159 | 190 | 221 | 252 | 283 | 314 | 345 | 376 | 407 | 438 | 469 | 500 | 531 | 562 | 593 | 624 | 655 | 686 | 717 | 748 | 779 | 810 | 841 | 872 | 903 | 934 | 965 |
| 4 | 35 | 66 | 97 | 128 | 160 | 191 | 222 | 253 | 284 | 315 | 346 | 377 | 408 | 439 | 470 | 501 | 532 | 563 | 594 | 625 | 656 | 687 | 718 | 749 | 780 | 811 | 842 | 873 | 904 | 935 | 966 |
| 5 | 36 | 67 | 98 | 129 | 161 | 192 | 223 | 254 | 285 | 316 | 347 | 378 | 409 | 440 | 471 | 502 | 533 | 564 | 595 | 626 | 657 | 688 | 719 | 750 | 781 | 812 | 843 | 874 | 905 | 936 | 967 |
| 6 | 37 | 68 | 99 | 130 | 162 | 193 | 224 | 255 | 286 | 317 | 348 | 379 | 410 | 441 | 472 | 503 | 534 | 565 | 596 | 627 | 658 | 689 | 720 | 751 | 782 | 813 | 844 | 875 | 906 | 937 | 968 |
| 7 | 38 | 69 | 100 | 131 | 163 | 194 | 225 | 256 | 287 | 318 | 349 | 380 | 411 | 442 | 473 | 504 | 535 | 566 | 597 | 628 | 659 | 690 | 721 | 752 | 783 | 814 | 845 | 876 | 907 | 938 | 969 |
| 8 | 39 | 70 | 101 | 132 | 164 | 195 | 226 | 257 | 288 | 319 | 350 | 381 | 412 | 443 | 474 | 505 | 536 | 567 | 598 | 629 | 660 | 691 | 722 | 753 | 784 | 815 | 846 | 877 | 908 | 939 | 970 |
| 9 | 40 | 71 | 102 | 133 | 165 | 196 | 227 | 258 | 289 | 320 | 351 | 382 | 413 | 444 | 475 | 506 | 537 | 568 | 599 | 630 | 661 | 692 | 723 | 754 | 785 | 816 | 847 | 878 | 909 | 940 | 971 |
| 10 | 41 | 72 | 103 | 134 | 166 | 197 | 228 | 259 | 290 | 321 | 352 | 383 | 414 | 445 | 476 | 507 | 538 | 569 | 600 | 631 | 662 | 693 | 724 | 755 | 786 | 817 | 848 | 879 | 910 | 941 | 972 |
| 11 | 42 | 73 | 104 | 135 | 167 | 198 | 229 | 260 | 291 | 322 | 353 | 384 | 415 | 446 | 477 | 508 | 539 | 570 | 601 | 632 | 663 | 694 | 725 | 756 | 787 | 818 | 849 | 880 | 911 | 942 | 973 |
| 12 | 43 | 74 | 105 | 136 | 168 | 199 | 230 | 261 | 292 | 323 | 354 | 385 | 416 | 447 | 478 | 509 | 540 | 571 | 602 | 633 | 664 | 695 | 726 | 757 | 788 | 819 | 850 | 881 | 912 | 943 | 974 |
| 13 | 44 | 75 | 106 | 137 | 169 | 200 | 231 | 262 | 293 | 324 | 355 | 386 | 417 | 448 | 479 | 510 | 541 | 572 | 603 | 634 | 665 | 696 | 727 | 758 | 789 | 820 | 851 | 882 | 913 | 944 | 975 |
| 14 | 45 | 76 | 107 | 138 | 170 | 201 | 232 | 263 | 294 | 325 | 356 | 387 | 418 | 449 | 480 | 511 | 542 | 573 | 604 | 635 | 666 | 697 | 728 | 759 | 790 | 821 | 852 | 883 | 914 | 945 | 976 |
| 15 | 46 | 77 | 108 | 139 | 171 | 202 | 233 | 264 | 295 | 326 | 357 | 388 | 419 | 450 | 481 | 512 | 543 | 574 | 605 | 636 | 667 | 698 | 729 | 760 | 791 | 822 | 853 | 884 | 915 | 946 | 977 |
| 16 | 47 | 78 | 109 | 140 | 172 | 203 | 234 | 265 | 296 | 327 | 358 | 389 | 420 | 451 | 482 | 513 | 544 | 575 | 606 | 637 | 668 | 699 | 730 | 761 | 792 | 823 | 854 | 885 | 916 | 947 | 978 |
| 17 | 48 | 79 | 110 | 141 | 173 | 204 | 235 | 266 | 297 | 328 | 359 | 390 | 421 | 452 | 483 | 514 | 545 | 576 | 607 | 638 | 669 | 700 | 731 | 762 | 793 | 824 | 855 | 886 | 917 | 948 | 979 |
| 18 | 49 | 80 | 111 | 142 | 174 | 205 | 236 | 267 | 298 | 329 | 360 | 391 | 422 | 453 | 484 | 515 | 546 | 577 | 608 | 639 | 670 | 701 | 732 | 763 | 794 | 825 | 856 | 887 | 918 | 949 | 980 |
| 19 | 50 | 81 | 112 | 143 | 175 | 206 | 237 | 268 | 299 | 330 | 361 | 392 | 423 | 454 | 485 | 516 | 547 | 578 | 609 | 640 | 671 | 702 | 733 | 764 | 795 | 826 | 857 | 888 | 919 | 950 | 981 |
| 20 | 51 | 82 | 113 | 144 | 176 | 207 | 238 | 269 | 300 | 331 | 362 | 393 | 424 | 455 | 486 | 517 | 548 | 579 | 610 | 641 | 672 | 703 | 734 | 765 | 796 | 827 | 858 | 889 | 920 | 951 | 982 |
| 21 | 52 | 83 | 114 | 145 | 177 | 208 | 239 | 270 | 301 | 332 | 363 | 394 | 425 | 456 | 487 | 518 | 549 | 580 | 611 | 642 | 673 | 704 | 735 | 766 | 797 | 828 | 859 | 890 | 921 | 952 | 983 |
| 22 | 53 | 84 | 115 | 146 | 178 | 209 | 240 | 271 | 302 | 333 | 364 | 395 | 426 | 457 | 488 | 519 | 550 | 581 | 612 | 643 | 674 | 705 | 736 | 767 | 798 | 829 | 860 | 891 | 922 | 953 | 984 |
| 23 | 54 | 85 | 116 | 147 | 179 | 210 | 241 | 272 | 303 | 334 | 365 | 396 | 427 | 458 | 489 | 520 | 551 | 582 | 613 | 644 | 675 | 706 | 737 | 768 | 799 | 830 | 861 | 892 | 923 | 954 | 985 |
| 24 | 55 | 86 | 117 | 148 | 180 | 211 | 242 | 273 | 304 | 335 | 366 | 397 | 428 | 459 | 490 | 521 | 552 | 583 | 614 | 645 | 676 | 707 | 738 | 769 | 800 | 831 | 862 | 893 | 924 | 955 | 986 |
| 25 | 56 | 87 | 118 | 149 | 181 | 212 | 243 | 274 | 305 | 336 | 367 | 398 | 429 | 460 | 491 | 522 | 553 | 584 | 615 | 646 | 677 | 708 | 739 | 770 | 801 | 832 | 863 | 894 | 925 | 956 | 987 |
| 26 | 57 | 88 | 119 | 150 | 182 | 213 | 244 | 275 | 306 | 337 | 368 | 399 | 430 | 461 | 492 | 523 | 554 | 585 | 616 | 647 | 678 | 709 | 740 | 771 | 802 | 833 | 864 | 895 | 926 | 957 | 988 |
| 27 | 58 | 89 | 120 | 151 | 183 | 214 | 245 | 276 | 307 | 338 | 369 | 400 | 431 | 462 | 493 | 524 | 555 | 586 | 617 | 648 | 679 | 710 | 741 | 772 | 803 | 834 | 865 | 896 | 927 | 958 | 989 |
| 28 | 59 | 90 | 121 | 152 | 184 | 215 | 246 | 277 | 308 | 339 | 370 | 401 | 432 | 463 | 494 | 525 | 556 | 587 | 618 | 649 | 680 | 711 | 742 | 773 | 804 | 835 | 866 | 897 | 928 | 959 | 990 |
| 29 | 60 | 91 | 122 | 153 | 185 | 216 | 247 | 278 | 309 | 340 | 371 | 402 | 433 | 464 | 495 | 526 | 557 | 588 | 619 | 650 | 681 | 712 | 743 | 774 | 805 | 836 | 867 | 898 | 929 | 960 | 991 |
| 30 | 61 | 92 | 123 | 154 | 186 | 217 | 248 | 279 | 310 | 341 | 372 | 403 | 434 | 465 | 496 | 527 | 558 | 589 | 620 | 651 | 682 | 713 | 744 | 775 | 806 | 837 | 868 | 899 | 930 | 961 | 992 |
| -1 | -1 | -1 | -1 | 155 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | 993 |

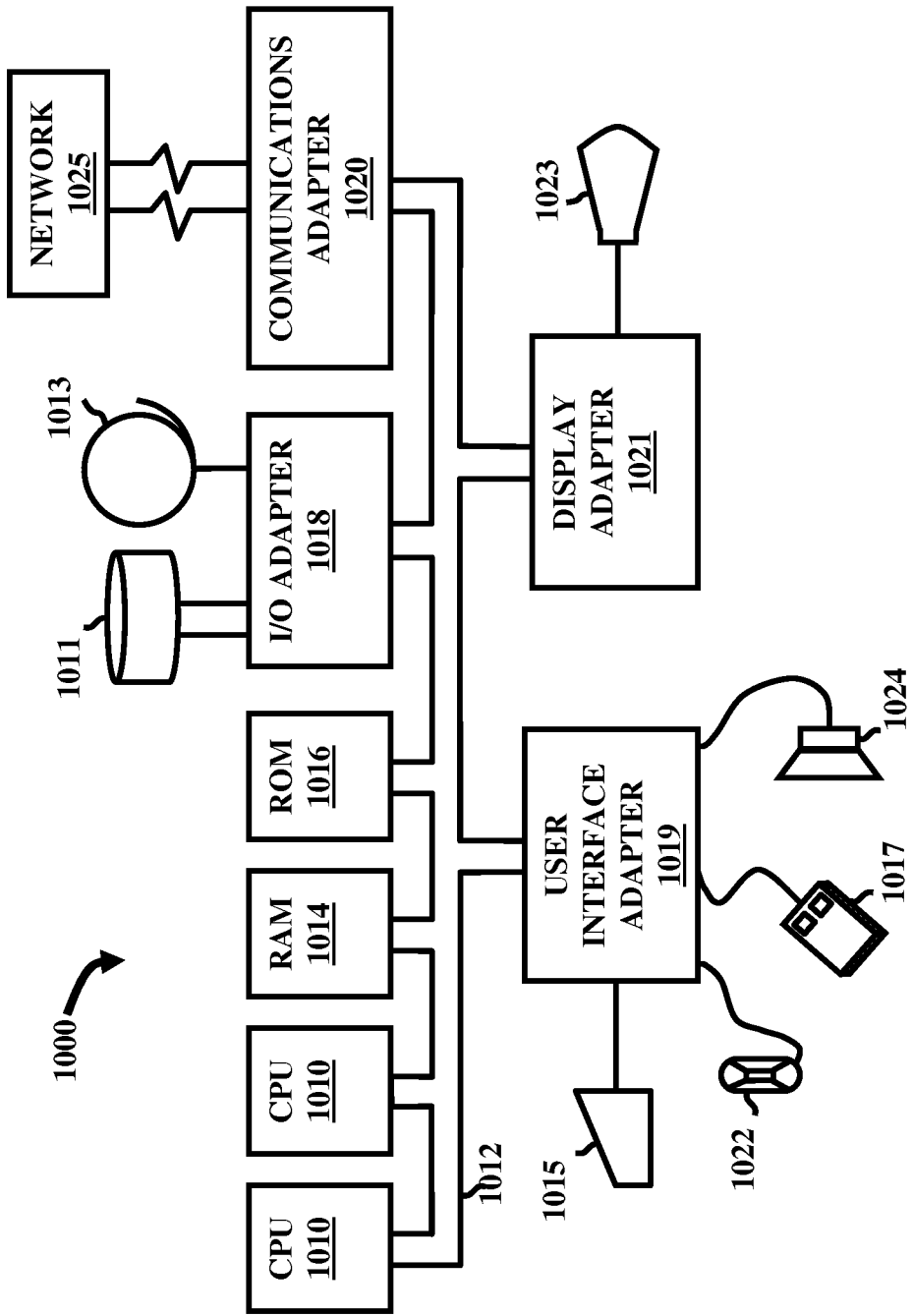

INTERLEAVER ADDRESS GENERATION IN TURBO DECODERS FOR WIRELESS COMMUNICATION SYSTEMS

CROSS REFERENCE TO RELATED APPLICATION

This application is a divisional of U.S. patent application Ser. No. 12/179,599 filed on Jul. 25, 2008, the contents of which, in its entirety, is herein incorporated by reference.

BACKGROUND

1. Technical Field

The embodiments herein generally relate to wireless communication, and, more particularly, to a method and an apparatus for timing and frequency acquisition in a MediaFLO™ (Forward Link Only) mobile multimedia multicast system.

2. Description of the Related Art

In recent years, the wireless industry has seen explosive growth in device capability, especially in relation to mobile devices, such as cell phones, handhelds, gaming consoles, etc. Ever-increasing demand for computing power, memory, and high-end graphic functionalities has accelerated the development of new and exciting wireless services. In the last few years, multiple technologies have been proposed to address delivery of streaming multimedia to mobile devices.

Multimedia communications provide a rich and immediate environment of image, graphics, sound, text and interaction through a range of technologies. An example of multimedia communication is streaming multimedia, which is primarily a delivery of continuous synchronized media data. The streaming multimedia is constantly received by, and displayed to an end user while it is being delivered by a provider. Multiple technologies such as Integrated Services Digital Broadcasting-Terrestrial (ISDB-T), Terrestrial-Digital Multimedia Broadcasting (T-DMB), Satellite-Digital Multimedia Broadcasting (S-DMB), Digital Video Broadcasting-Handheld (DVB-H), and FLO (Forward Link Only) are used to address the delivery of streaming multimedia to mobile devices. These technologies have typically leveraged upon either third generation cellular/PCS, or digital terrestrial TV broadcast technologies.

For delivering unprecedented volumes of high-quality, streaming or clipped, audio and video multimedia to wireless subscribers, an air interface has been developed based on FLO technology for MediaFLO™ mobile multimedia multicast system available from Qualcomm, Inc., Calif., USA. MediaFLO™ or media forward link only is a combination of the media distribution system and the FLO technology. The FLO technology is the ability to deliver a rich variety of content choice to consumers while efficiently utilizing spectrum as well as effectively managing capital and operating expenses for service providers. The details of the MediaFLO mobile multimedia multicast system are available in Chari, M. et al., "FLO Physical Layer: An Overview," IEEE Transactions on Broadcasting, Vol. 53, No. 1, March 2007, the contents of which, in its entirety, is herein incorporated by reference.

FLO technology was designed specifically for the efficient and economical distribution of the same multimedia content to millions of wireless subscribers simultaneously. Also, the FLO technology was designed from the ground up to be a multicasting network, which is overlaid upon a cellular network. It does not need to support any backward compatibility constraints. Thus, both the network infrastructure and the receiver devices are separate from those for the cellular/PCS network. Moreover, as the name suggests, the technology relies on the use of a forward link (network to device) only.

FLO enables reducing the cost of delivering such content and enhancing the user experience, allowing consumers to "surf" channels of content on the same mobile handsets they use for traditional cellular voice and data services.

MediaFLO™ technology can provide robust mobile performance and high capacity without compromising power consumption. The technology also reduces the network cost of delivering multimedia content by dramatically decreasing the number of transmitters needed to be deployed. In addition, MediaFLO™ technology-based multimedia multicasting complements wireless operators' cellular network data and voice services, delivering content to the same cellular handsets used on 3G networks.

The MediaFLO™ wireless system has been designed to broadcast real time audio and video signals, apart from non-real time services to mobile users. The system complements existing networks and radically expands the ability to deliver desired content without impacting the voice and data services. Operators can leverage the MediaFLO™ system to increase average revenue per user (ARPU) and reduce churn by offering enhanced multimedia services. Content providers can take advantage of a new distribution channel to extend their brand to mobile users. Device manufacturers will benefit from increased demand for multimedia-enabled handsets as consumer appetite grows for the rich content provided through MediaFLO™ systems.

The MediaFLO™ service is designed to provide the user with a viewing experience similar to a television viewing experience by providing a familiar type of program-guide user interface. Users can simply select a presentation package, or grouping of programs, just as they would select a channel to subscribe to on television. Once the programs are selected and subscribed to, the user can view the available programming content at any time. In addition to viewing high quality video and audio content and IP data, the user may also have access to related interactive services, including the option to purchase a music album, ring tone, or download of a song featured in a music program. The user can also purchase access to on-demand video programming, above and beyond the content featured on the program guide.

The respective MediaFLO™ system transmission is carried out using tall and high power transmitters to ensure wide coverage in a given geographical area. Further, it is common to deploy 3-4 transmitters in most markets to ensure that the MediaFLO™ system signal reaches a significant portion of the population in a given market. During the acquisition process of a MediaFLO™ system data packet several determinations and computations are made to determine such aspects as frequency offsets for the respective wireless receiver. Given the nature of MediaFLO™ system broadcasts that support multimedia data acquisitions, efficient processing of such data and associated overhead information is paramount. For instance, when determining frequency offsets or other parameters, complex processing and determinations are required where determinations of phase and associated angles are employed to facilitate the MediaFLO™ system transmission and reception of data.

The FLO system is comprised of two parts: (a) The FLO network, which includes the collection of transmitters and the backhaul network, and (b) The FLO device, which may be any type of communicating devices such as a cell phone, computer, personal assistant, laptop, handheld, or gaming consoles, etc. FIG. 1 illustrates a FLO system 100 for a MediaFLO™ system. The system 100 includes one or more transmitters 110 that communicate across a wireless network 130 to one or more receivers 120.

The FLO system 100 is utilized in developing an air interface for the MediaFLO™ mobile multicast system. The air interface uses Orthogonal Frequency Division Multiplexing (OFDM) as the modulation technique, which is also utilized by Digital Audio Broadcasting (DAB), (DVD-T), and (ISDB-T).

To ensure that the user experience is as uniform as possible over the entire coverage area and optimize spectral efficiency and network economics, FLO system 100 employs the concept of Single Frequency Network (SFN) operation.

Typically, the address generation logic accepts an input address data ranging between 0 and 1023 and generates an output address data lying between 0 and 1023. However, an address generation logic utilized in a turbo decoder also accepts tail bits addresses along with the input address data. Furthermore, an output address data having a value more than 993 is considered invalid and accordingly discarded.

FIG. 2 illustrates a conventional address generation module 200 according to the MediaFLO™ specification, adapted to translate the address of information as explained in conjunction with FIG. 1. The address generation module 200 comprises a small look-up table (LUT) 202 and a multiplier 204. The LUT 202 and the multiplier 204 are adapted to work with other associated circuitry, such as an adder module 206, a bit-reversing module 208 and an output module 210, for translating the address of information. Further, the address generation module 200 is provided with a 10 bit input address data 212, which is processed to generate an output address data 214. As explained earlier, the output address data 214 may have a value ranging between 0 and 1023. However, the output address data 214 must have a value less than or equal to 993 to be considered valid by the address generation module 200. The output module 210 of the address generation module 200 is adapted to determine the validity of the output address data 214 by determining a value of the output address data 214.

However, a conventional address generation module, such as the address generation module 200, does not guarantee a valid output address data 214 each time the input address data 212 is processed. Upon encountering the invalid output address data 214 for a particular input address data 212, the address generation module 200 discards the output address data 214. Thereafter, the address generation module 200 increments the input address data 212 by 1 and processes the new input address data to generate a corresponding output address data. Further, the new output address data is analyzed by the output module 210 for determining validity of the output address data. Accordingly, generation of a valid output address data 214 by the address generation module 200 may be a lengthy process. More specifically, the address generation module 200 may, in certain cases, require two clock pulses to generate a valid output address data 214.

Further, the address generation module 200 only accepts sequential input, which has a starting value of 0. However, a sliding window turbo decoder, which is a widely used in a Very Large Scale Integration (VLSI) implementation of the turbo decoder, does not accept a sequential input. Also, an input address data to the sliding window turbo decoder does not have a starting value of 0. Accordingly, the address generation module 200 cannot be utilized in the sliding window turbo decoders.

A known approach to meet the above problems is to implement a large LUT in the address generation module 200. The large LUT may have 994 possible entries of valid output address data and corresponding input address data. Each entry of the LUT is of 10 bits. However, implementation of the large LUT in an application specific integrated chip (ASIC) chip may utilize a large area of the ASIC chip. Alternatively, the large LUT may require a standalone read only memory (ROM) to store the 994 entries. Further, to achieve a high data rate with a low clock rate, the Turbo decoder may utilize multiple sliding windows, thereby requiring multiple ROMs for each of the sliding windows. Implementation of multiple ROMs in the ASIC chip may occupy a substantial area of the chip, which is undesirable.

Accordingly, there persists a need for an address generation module, which is adapted to meet the afore-mentioned shortcomings of the conventional solutions. More specifically, there persists a need for an address generation module, which generates a valid output address data without requiring a large memory space. Moreover, there persists a need for an address generation module, which generates a valid output address data with lesser number of clock pulses as compared to the conventional solutions.

SUMMARY

In view of the foregoing, an embodiment herein provides an apparatus for generating an address for interleaving in a wireless communication system. The apparatus comprises at least one input generation module that generates at least one input signal. The apparatus further comprises a first address generator module and a second address generator module operatively coupled to the at least one input generation module. The first address generator module and the second address generator module receive the at least one input signal from the at least one input generation module for generating a first output address for interleaving and a second output address for interleaving. Moreover, the apparatus comprises a selector module operatively coupled to the first address generator module and the second address generator module. The selector module selects an address for interleaving from the first output address for interleaving and the second output address for interleaving based on predetermined criteria.

Another embodiment herein provides a system for generating an address for interleaving in a wireless communication system. The system comprises at least one input translation module that receives an input signal. The at least one input translation module further translates the received input signal to generate a nominal input signal based on a value of the received input signal. The system further comprises an address generation module operatively coupled to the at least one input translation module. The address generation module receives the nominal input signal and generate an address for interleaving based on the nominal input signal. The address for interleaving is equal to or less than a predetermined value that is dependent on a number of bits in the input signal.

Yet another embodiment herein provides a method for generating an address for interleaving in a wireless communication system. The method comprises receiving an input signal for generating an address for interleaving. The method further comprises translating the received input signal into a nominal input signal. The received input signal is translated into nominal input signal based upon a value of the received input signal. Furthermore, the method comprises processing the nominal input signal for generating the address for interleaving.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 1 illustrates a FLO system for a MediaFLO™ system according to an embodiment herein;

FIG. 2 illustrates a conventional address generation module configured according to the MediaFLO™ specification;

FIG. 5 illustrates a table having entries representing values of an output address data of the system of FIG. 4;

FIG. 6 illustrates a table having entries representing values of an input signal to the system of FIG. 4;

FIG. 7 illustrates a table having entries representing values of a nominal input signal generated by the system of FIG. 4;

FIG. 10 illustrates a schematic diagram of a computer architecture used in accordance with the embodiments herein.

DETAILED DESCRIPTION OF PREFERRED EMBODIMENTS

Figure 3:
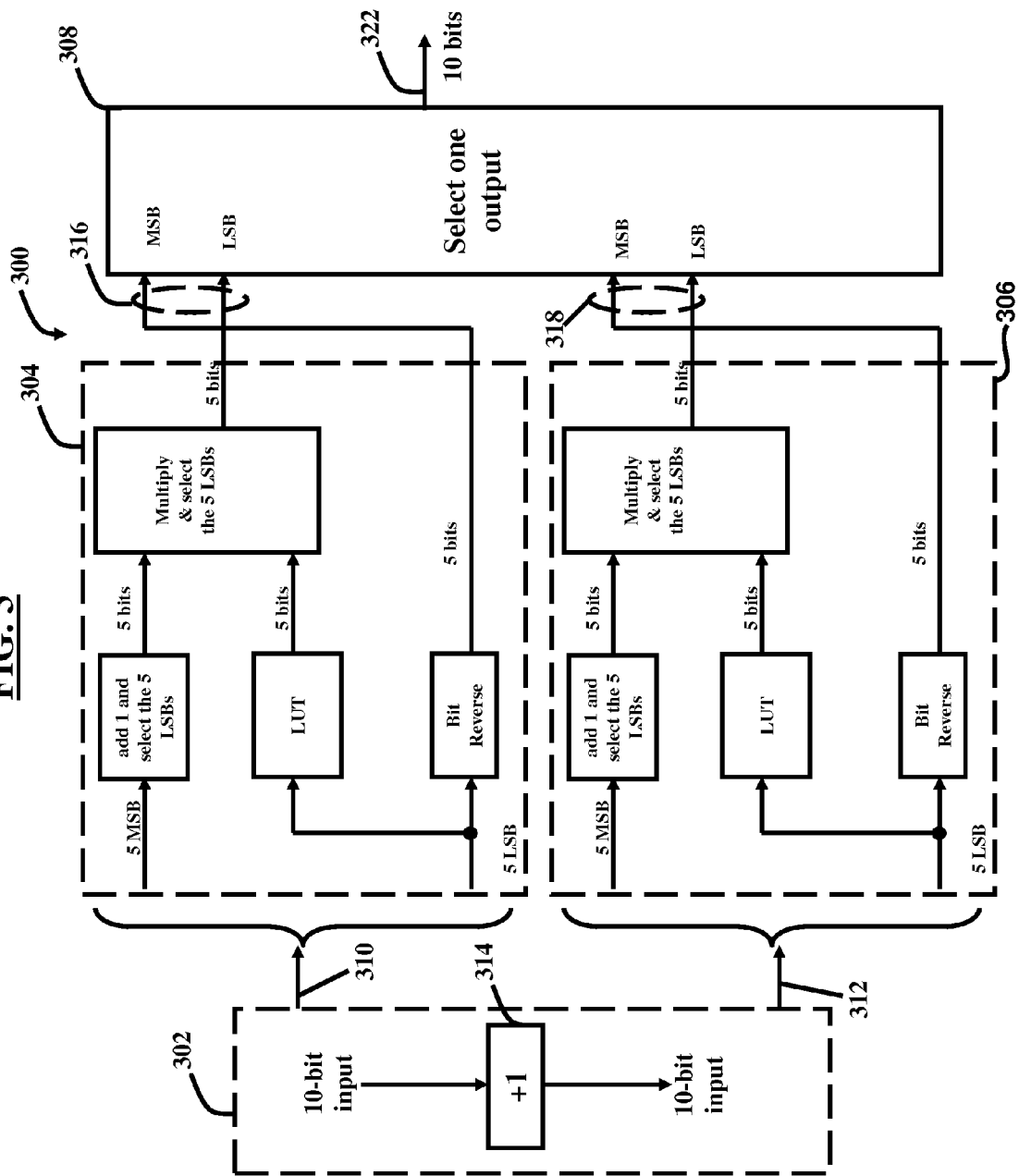
FIG. 3 illustrates an apparatus for generating address for interleaving in accordance with an embodiment herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments herein provide an efficient processing of data and associated overhead information in a mobile multimedia multicast system by providing an efficient technique of generating address for interleaving the information in the mobile system. Moreover, the embodiments herein provide a technique for the address generation logic of the interleaver or the deinterleaver, which translates the address of the normal sequenced data to the address of the interleaved sequenced data, or vice versa. Referring now to the drawings, and more particularly to FIGS. 1 through 10, where similar reference characters denote corresponding features consistently throughout the figures, there are shown preferred embodiments.

The FLO system 100 (of FIG. 1) multicasts several services. A service is an aggregation of one or more related data components, such as the video, audio, text or signaling associated with a service. In an embodiment, the services are classified into two types based on their coverage area: Wide-area services and Local-area services. A Local-area service is multicast for reception within a metropolitan area. By contrast, Wide-area services are multicast in one or more metropolitan areas. The term Local-area is used to denote the transmitters within a metropolitan area. The term Wide-area is used to denote transmitters in one or more metropolitan areas that multicast the same Wide-area services. Thus, a Wide-area contains one or more Local-areas, with the transmitters in the different Local-areas multicasting different local area services and in an embodiment, using different radio frequency (RF) center frequencies.

FLO services are carried over one or more logical channels. These logical channels are called Multicast Logical Channels (MLC). An important aspect is that MLCs are distinguishable at the physical layer. For example, the video and audio components of a given service can be sent on two different MLCs. A FLO device (a receiver from the plurality of receivers 120) that is interested in the audio component can only receive the corresponding MLC without receiving the MLC for the video component, thereby saving battery resources.

The statistical multiplexing of different services, or MLCs, is achieved by varying only the MLC time and frequency allocations over prescribed time intervals to match the variability in the MLC's source rates. Statistical multiplexing in FLO enables the receivers 120 to demodulate and decode only the MLC(s) of interest.

The data rates required by the services are expected to vary over a wide range, depending on their multimedia content. Thus, effective use of statistical multiplexing can significantly increase the number of services supported by a multicast system using a specified channel bandwidth.

Information being transmitted over the wireless network 130 may be prone to burst errors, which may alter the information substantially such that it is difficult for the receivers 120 to recover the original information. More specifically, the burst errors may alter a substantial number of bits of the information such that it is not possible for the receivers 120 to recover the original information from the received information. In a typical FLO system 100, the burst errors may be caused due to impairments in a communication channel of the FLO system 100.

Accordingly, turbo coding is utilized in the transmitters, such as the transmitter 110, of the FLO system 100 for rendering the information less prone to burst errors. A typical transmitter 110 of the FLO system 100 may utilize a turbo encoder of block size 1000 bits to ensure protection against burst errors. Further, a turbo encoder comprises an interleaver for interleaving bits of the information, thereby improving an immunity of the information against the burst errors. The receivers, such as the receivers 120, of the FLO system 100 may utilize turbo decoders comprising an interleaver and a deinterleaver, for recovering the original information from the received information.

The interleaver and the deinterleaver may be implemented by utilizing a memory module, such as a random access memory (RAM), and address generation logic. Furthermore, the interleaver writes data into the memory in a normal or uninterleaved sequence of bits and read out the data in an interleaved sequence of bits achieved by processing the normal sequence of bits. Alternatively, a deinterleaver writes data into the memory in an interleaved sequence while the data is output in a normal sequence. The normal sequenced data and the interleaved data may be stored in a particular location in the memory.

FIG. 3 illustrates an apparatus 300 for generating an address for interleaving in accordance with an embodiment herein. The apparatus 300 comprises at least one input generation module 302, a first address generator module 304 and a second address generator module 306 operatively coupled to the input generation module 302, and a selector module 308 operatively coupled to the module 304 and the module 306.

The input generation module 302 generates a first input signal 310 and a second input signal 312 for the module 304 and the module 306, respectively. Further, the input generation module 302 is configured to generate the second input signal 312 such that the second input signal 312 has a value, which is obtained by incrementing a value of the first input signal 310 by one. Accordingly, the module 304 and the module 306 are provided with input signals, which have difference in their values by unity. In one embodiment, the input generation module 302 may utilize an adder circuit 314 to increment the value of the first input signal 310 to obtain the second input signal 312. However, it will be evident to a person skilled in the art that other circuitry may also be utilized to generate the first input signal 310 and the second input signal 312.

Furthermore, the module 304 and the module 306 receive the first input signal 310 and the second input signal 312 for generating an output address data for interleaving. The module 304 and the module 306 have configurations similar to that of conventional address generators, such as the address generator module 200 explained in accordance with FIG. 2. More specifically, the module 304 and the module 306 comprise standard components of the address generation module 200, such as the small LUT 202 and a multiplier 204 along with the associated circuitry of FIG. 2.

The module 304 and the module 306 process the first input signal 310 and the second input signal 312 to generate a first output address data 316 and a second output address data 318, respectively. The first output address data 316 and the second output address data 318 are similar to the output address data 214 explained in conjunction with FIG. 2. Further, the first output address data 316 and the second output address data 318 are transmitted to the selector module 308 for further processing.

The selector module 308 receives the first and the second output address data 316 and 318, which are processed to determine validity of the output address data 316 and 318, and to output a valid output address data 322. More specifically, the selector module 308 analyzes a value of the first and the second output address data 316 and 318, to determine an invalid output address data out of the two output address data 316, 318. Accordingly, the output address data having a value more than 993 is discarded while the valid output address data is selected and transmitted, thereby enabling the apparatus 300 to always output a valid output address data.

In use, the input generation module 302 of the apparatus 300 generates the first and the second input address data 310 and 312, such that a value of the second input address data 312 is one more than a value of the first input address data 310. The two input address data are transmitted to the module 304 and the module 306, which processes the respective input address data 310, 312 to generate the first and the second output address data 316 and 318. The first and the second output address data 316 and 318 are transmitted to the selector module 308, which determines a validity of the two output address data. More specifically, the selector module 308 selects an output address data, out of the first and the second output address data 316 and 318, to output a valid address data 322. The valid address data 322 has a value equal to or less than 993. Accordingly, the output address data having a value greater than 993 is rejected and discarded.

The apparatus 300 provides address generation, which generates a valid output address data within one clock cycle unlike the prior art address generation modules, such as the address generation module 200. Further, the apparatus 300 utilizes a smaller LUT as compared to the conventional solutions, thereby avoiding a need for a large memory module.

Figure 4:
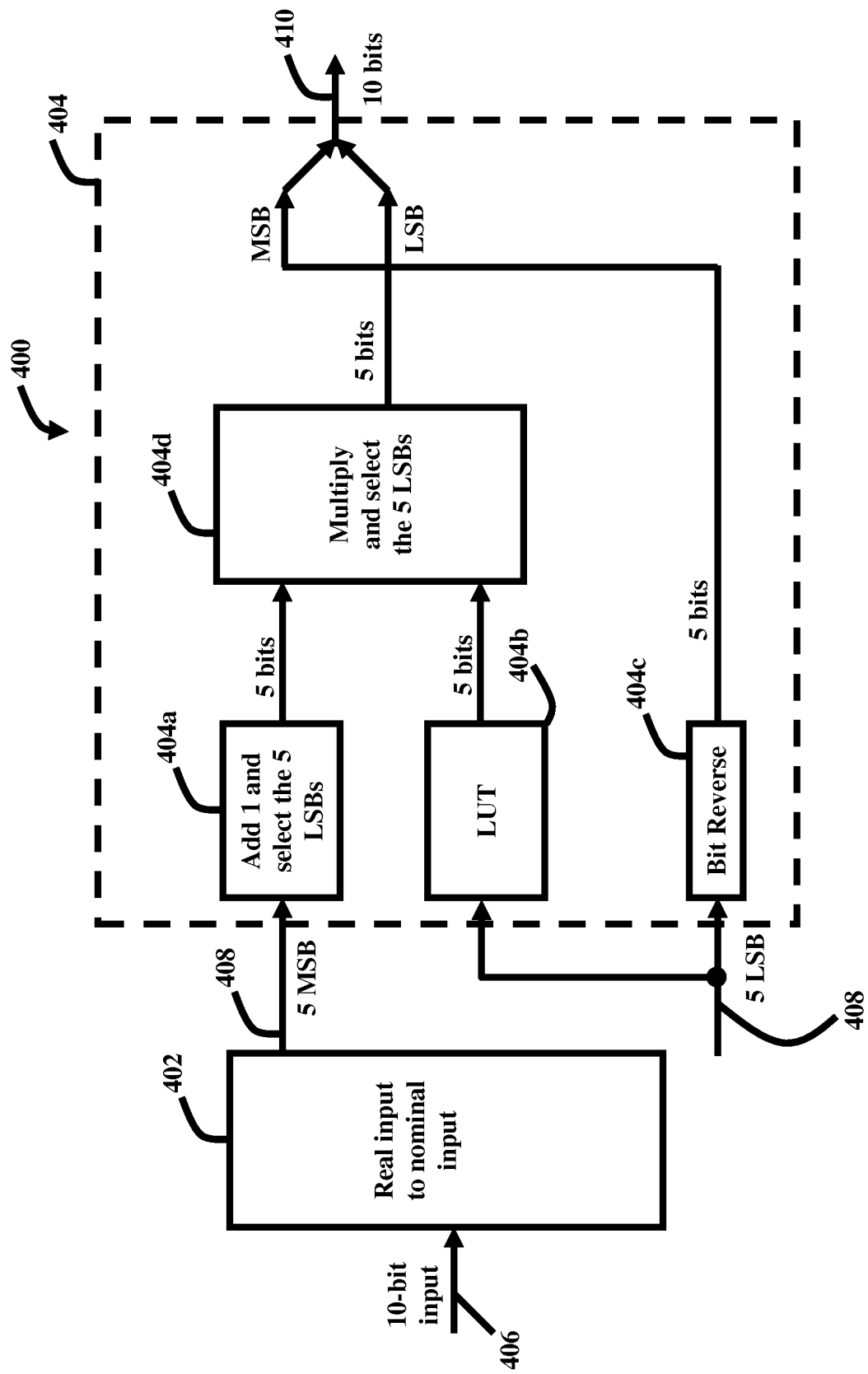
FIG. 4 illustrates a system for generating address for interleaving in accordance with another embodiment herein.

FIG. 4 illustrates a system 400 for generating an address for interleaving, in accordance with another embodiment herein. The system 400 is configured in a manner to always generate a valid output address data, thereby requiring lesser number of clock pulses and a smaller memory space as compared to the conventional solutions. To achieve the above, the system 400 comprises an input translation module 402 and an address generation module 404 operatively coupled to the input translation module 402. The input translation module 402 receive a 10-bit input signal 406, representing the input address data, having a value ranging essentially between 0 and 993. It will be evident to a person skilled in the art that the input translation module 402 and the address generation module 404 may include hardware, software, or a combination of both.

Further, the address generation module 404 is similar in configuration to the address generation module 200 explained in conjunction with FIG. 2. More specifically, the address generation module 404 comprises an adder 404a, a small LUT 404b, a bit reversing module 404c, and a multiplier 404d. However, the address generation module 404 does not have an output module, such as the output module 210 of the address generation module 200. The absence of the output module is attributed to the fact that the system 400 always generates a valid output address data, thereby avoiding a need for determining validity of the output address data. Accordingly, the system 400 does not require the output module in the address generation module 404.

Further, the input translation module 402 translates the input signal 406 to a nominal input signal 408 (classified as 5 most significant bits (MSB) and 5 least significant bits (LSB)). The nominal input signal 408 is transmitted to the address generation module 404 for generating an output address data 410, similar to output address data 214 explained in conjunction with FIG. 1. However, the nominal input signal 408 is configured in a manner so as to guarantee a valid output address data 410 from the address generation module 404. More specifically, the nominal input signal 408 upon processing by the address generation module 404 always generates a valid output address data 410. Accordingly, the system 400 always generates a valid output address data 410 within a single clock pulse, unlike the conventional solutions. The manner in which this is achieved as well as further description of the input signal 406 and the nominal input signal 408 is explained in conjunction with FIGS. 5 to 7 described below.

Figure 5:
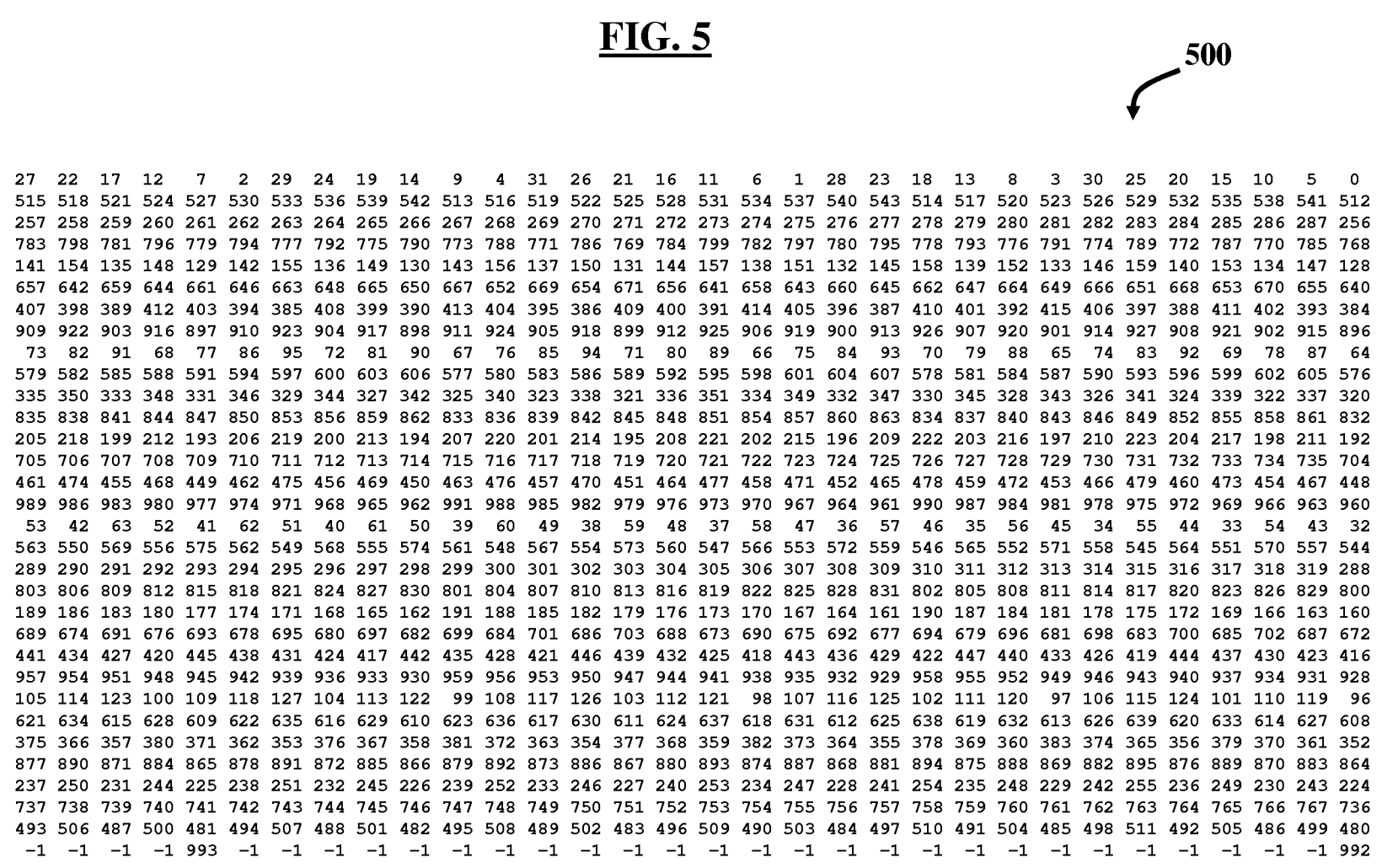

FIG. 5 illustrates a table 500 organized into 32 rows and 32 columns having entries representing values of the output address data 410 of the system 400 of FIG. 4. Further, the entries in the table 500 representing the invalid values of the output address data 410 are replaced with '−1' while the entries representing valid values of the output address data 410 are retained as it is.

Moreover, FIG. 6 illustrates a table 600 having entries representing values of the input signal 406 to the system 400 of FIG. 4. The table 600 comprises 32 rows and 32 columns having entries representing the values of the input signal 406.

As illustrated in FIG. 6, the table 600 has values ranging from 0 to 993. The values greater than 993 are replaced with '−1' to represent invalid values of the input signal 406.

Additionally, the input translation module 402 translates the input signal 406 to generate the nominal input signal 408 by utilizing the following equations:

$$I_n = I_r + \text{floor}(I_r/32), \text{ when } I_r < 155 \text{ and floor}(I_r/32) < 31 - (I_r \bmod 32) \quad (1)$$

$$I_n = I_r + \text{floor}(I_r/32) + 1, \text{ when } I_r < 155 \text{ and floor}(I_r/32) > 31 - (I_r \bmod 32) \quad (2)$$

$$I_n = 159, \text{ when } I_r = 155 \quad (3)$$

$$I_n = (I_r - 1) + \text{floor}[(I_r - 1)/32], \text{ when } 155 < I_r < 993 \text{ and floor}[(I_r - 1) < 31 - [(I_r - 1) \bmod 32] \quad (4)$$

$$I_n = (I_r - 1) + \text{floor}[(I_r - 1)/32] + 1, \text{ when } 155 < I_r < 993 \text{ and floor}[(I_r, 1) > 31 - [(I_r - 1) \bmod 32] \quad (5)$$

$$I_n = 1023, \text{ when } I_r = 993 \quad (6)$$

where $I_r$ is input signal 406, $I_n$ is nominal input signal 408 and floor(x) is a standard mathematical function, which returns a highest integer less than or equal to x.

Figure 7:
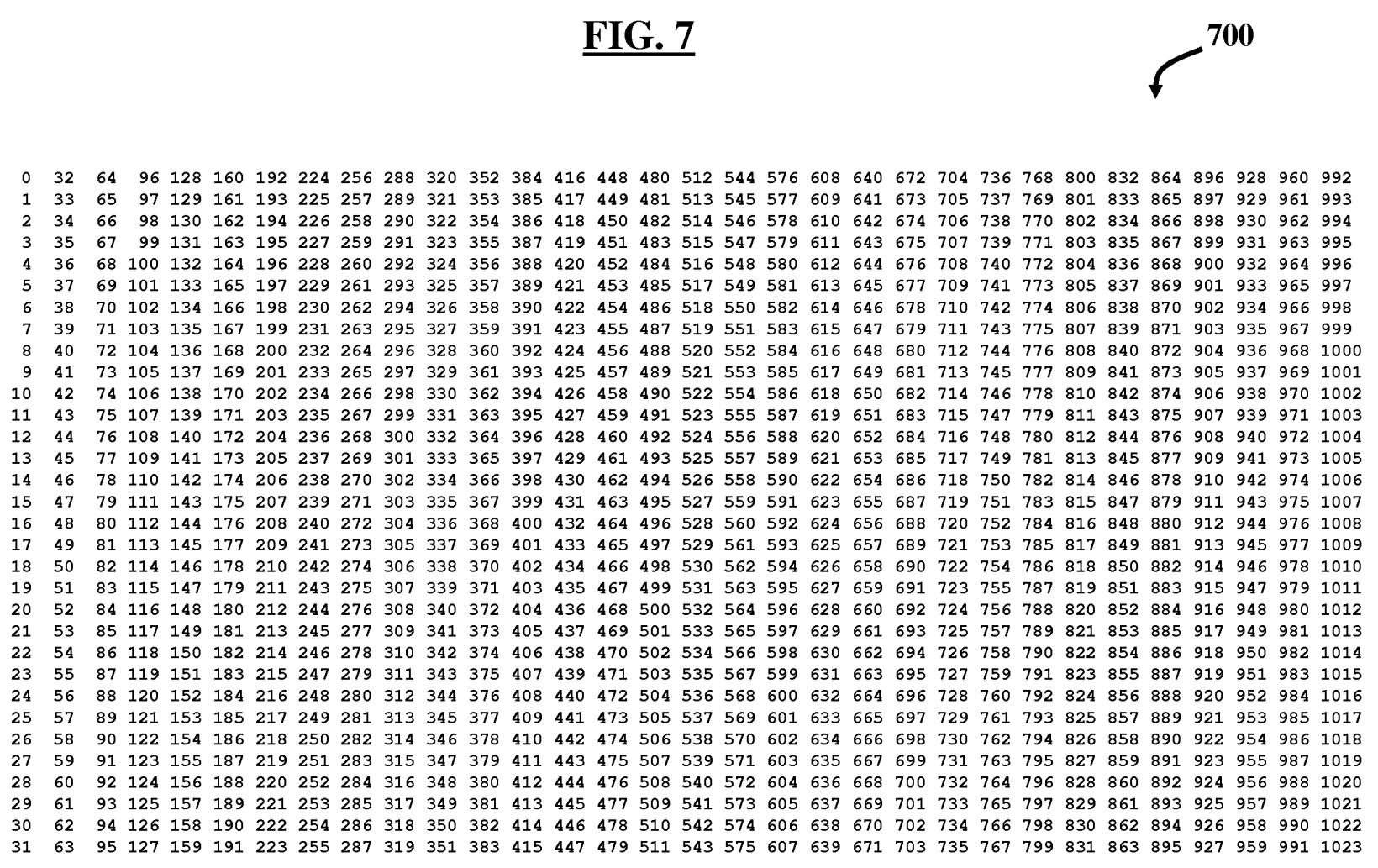

Accordingly, depending on the value of the input signal 406, a corresponding value of the nominal input signal 408 is generated by using one of the equations (1) to (6). FIG. 7 illustrates a table 700 comprising 32 rows and 32 columns having entries representing values of the nominal input signal 408 obtained by utilizing equations (1) to (6). Further, the hardware circuitry for generating the nominal input signal 408 comprises a plurality of adders and multiplexers, which will be explained in detail in conjunction with FIG. 9.

Figure 8B:
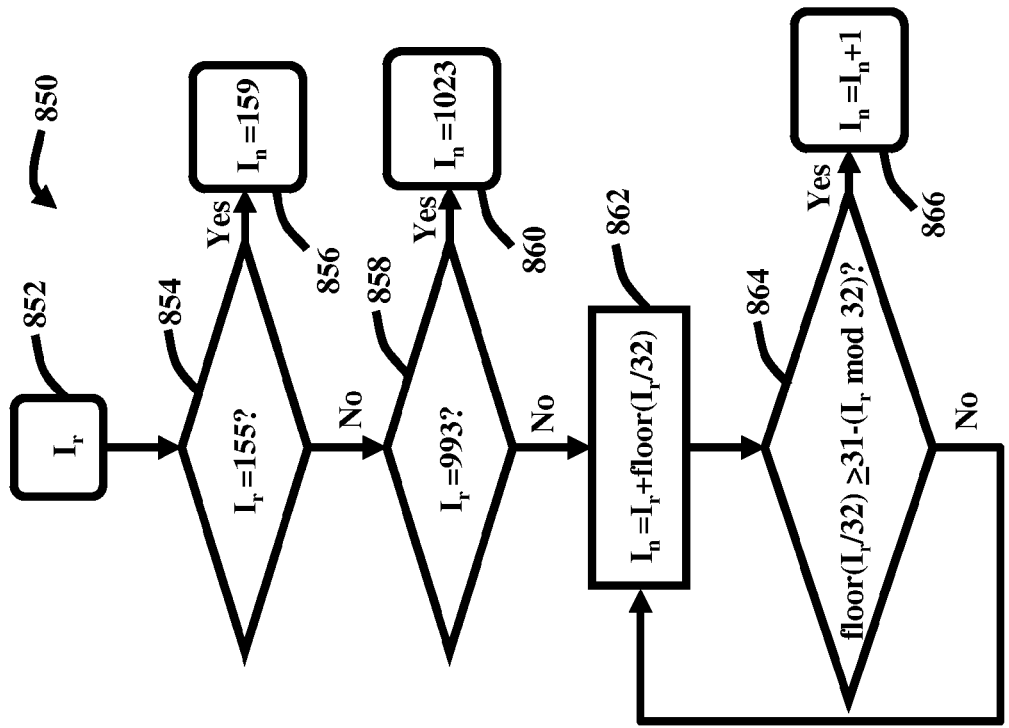
FIG. 8B illustrates a flow diagram representing a method for translating the input signal to the nominal input signal in the system of FIG. 4.
Figure 8A:
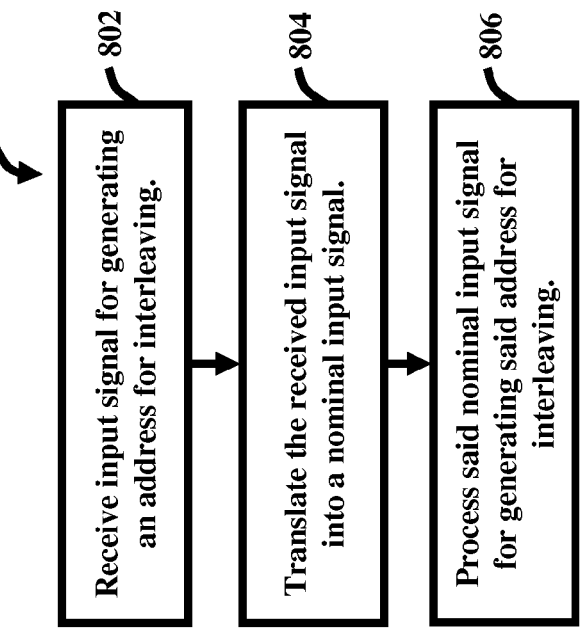
FIG. 8A illustrates a flow diagram representing a preferred method for generating an address for interleaving in accordance with the embodiment herein.

FIG. 8A, with reference to FIGS. 1 and 4, is a flow diagram representing a method 800 for generating an address for interleaving in a wireless communication system 100. The method 800 is utilized in the system 400 for generating the address for interleaving. The method 800 commences at step 802 by receiving the input signal, such as the input signal 406. In the system 400, the input signal is received at the input translation module 402. Further, the received input signal is of 10 bits and a value of the received input signal ranges between 0 and 993. Thereafter, at step 804, the received input signal 406 is translated into a nominal input signal 408 based upon a value of the received input signal 406. The translation of the received input signal 406 into the nominal input signal 408 will be explained in detail in conjunction with FIG. 8B. Subsequently, at step 806, the nominal input signal 408 is processed in the address generation module 404 for generating the address for interleaving.

Referring now to FIG. 8B, with reference to FIGS. 4 and 8A, a method 850 for translating the input signal 406 to the nominal input signal 408 is illustrated. At step 852, the input translation module 402 receives the input signal 406. More specifically, step 852 is similar to step 802 of the method 800. At step 854, the input translation module 402 determines whether the input signal 406 is equal to 155. If the input translation module 402 determines that the input signal 406 is equal to 155 (Yes), then the process 850 proceeds to step 856 where the nominal input signal 408 is assigned a value 159. Otherwise (No), at step 858, the input translation module 402 determines whether the input signal 406 is equal to 993.

If the input translation module 402 determines that the input signal 406 is equal to 993 (Yes), then the process 850 proceeds to step 860 where the nominal input signal 408 is assigned a value equal to 1023. Otherwise (No), at step 862, the nominal input signal 408 is assigned a value estimated as $I_r + \text{floor}(I_r/32)$, where $I_r$ is the input signal 406.

Furthermore, at step 864, the input translation module 402 computes the following equation: floor $(I_r/32) \geq 31$ ($I_r$ mod 32), where $I_r$ is the input signal 406. If the result of this equation is true (Yes), then the process 850 proceeds to step 866 where the input translation module 402 assigns a value to the nominal input signal 408 given by $I_r + \text{floor}(I_r/32) + 1$. Otherwise (No), the value of the nominal input signal is retained as $I_r + \text{floor}(I_r/32)$, which is assigned at step 862.

Accordingly, by implementing the method 850 provided by the embodiments herein, the input translation module 402 generates a nominal input signal 408 for all values of the input signal 406. The generated values of the nominal input signal 408 are utilized to populate the table 700 as illustrated in FIG. 7.

Figure 9:
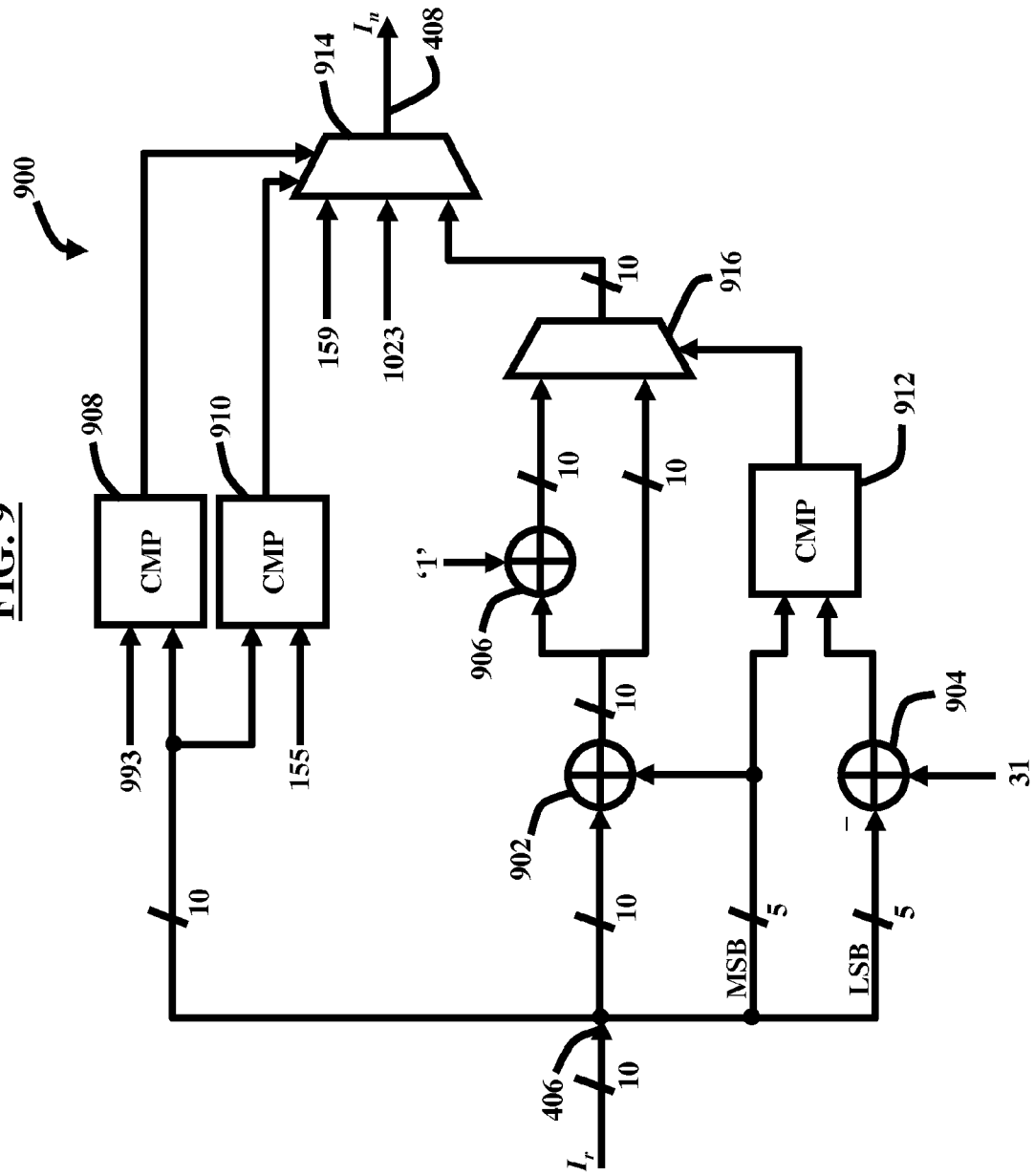
FIG. 9 illustrates a hardware circuitry utilized for translating the input signal into the nominal input signal in the system of FIG. 4.

FIG. 9, with reference to FIG. 4, illustrates hardware circuitry 900 utilized for translating the input signal 406 into the nominal input signal 408 of FIG. 4. The hardware circuitry 900 comprises a plurality of adders 902, 904, 906; a plurality of comparators 908, 910, 912; and a plurality of multiplexers 914, 916. These components of the hardware circuitry 900 are configured to implement the equations (1) to (6) previously described above. The hardware circuitry 900 is one exemplary embodiment of the hardware circuitry that may be utilized to implement the equations (1) to (6). However, it will be evident to a person skilled in the art that any other hardware circuitry may also be utilized to implement the equations (1) to (6). In FIG. 9, the comparators 908, 910 correspond to the conditional branches 854, 858 in FIG. 8B. The function floor $(I_r/32)$ in step 812 is achieved by taking five most significant bits (MSBs) of the input 406. The step 862 is computed with the adder 902 in FIG. 9. The conditional branch 864 is implemented as comparator 912 in FIG. 9, which compares the five MSBs of the input 406 with the output of the adder 904. The adder 904 behaves as a subtractor that subtracts the five least significant bits (LSBs) of the input 406 from number 31. The last adder 866 is implemented with the adder 906. The multiplexer 916 outputs either the result of adder 902 or the result of adder 906 based on the comparison result of the comparator 912. The multiplexer 914 outputs either number 159, number 1023, or the output of the multiplexer 916 based on the comparison results from comparators 908 and 910. The output of the multiplexer 914 becomes the output $I_n$, 408.

The techniques provided by the embodiments herein may be implemented on an integrated circuit chip (not shown). The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The embodiments herein can include both hardware and software elements. The embodiments that are implemented in software include but are not limited to, firmware, resident software, microcode, etc.

The techniques provided by the embodiments herein may be implemented on an integrated circuit chip (not shown). The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The embodiments herein can take the form of an entirely hardware embodiment, an entirely software embodiment or an embodiment including both hardware and software elements. The embodiments that are implemented in software include but are not limited to, firmware, resident software, microcode, etc.

Furthermore, the embodiments herein can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

A representative hardware environment for practicing the embodiments herein is depicted in FIG. 10. This schematic drawing illustrates a hardware configuration of an information handling/computer system 1000 in accordance with the embodiments herein. The system 1000 comprises at least one processor or central processing unit (CPU) 1010. The CPUs 1010 are interconnected via system bus 1012 to various devices such as a random access memory (RAM) 1014, read-only memory (ROM) 1016, and an input/output (I/O) adapter 1018. The I/O adapter 1018 can connect to peripheral devices, such as disk units 1011 and tape drives 1013, or other program storage devices that are readable by the system 1000. The system 1000 can read the inventive instructions on the program storage devices and follow these instructions to execute the methodology of the embodiments herein. The system 1000 further includes a user interface adapter 1019 that connects a keyboard 1015, mouse 1017, speaker 1024, microphone 1022, and/or other user interface devices such as a touch screen device (not shown) to the bus 1012 to gather user input. Additionally, a communication adapter 1020 connects the bus 1012 to a data processing network 1025, and a display adapter 1021 connects the bus 1012 to a display device 1023 which may be embodied as an output device such as a monitor, printer, or transmitter, for example.

Accordingly, the systems and methods described herein provide a reliable technique to generate an address for interleaving with lesser number of clock pulses unlike the conventional solutions, thereby reducing a processing time of the interleaver. Furthermore, the different embodiments for generating address for interleaving, as described herein, have simple configurations and require a small area in an application specific integrated circuit (ASIC) chip for implementation.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A system for generating an address for interleaving in a wireless communication system, said system comprising:
   a first module that receives and translates an input signal to generate a nominal input signal based on a value of the received input signal, wherein said first module:
   estimates a value of said nominal input signal as 159 when said value of said received input signal is 155;
   estimates said value of said nominal input signal as 1023 when said value of said received input signal is 993; and
   estimates said value of said nominal input signal for other values of said received input signal using: $I_n = I_r + \text{floor}(I_r/32)$, wherein $I_n$ comprises said value of said nominal input signal, $I_r$ comprises said value of said received input signal, and floor(x) comprises a standard mathematical function that generates a highest integer less than or equal to x;
   a pair of second modules operatively coupled to said first module, wherein said pair of second modules receive said nominal input signal from said first module and generate a first and second output address for interleaving based on said nominal input signal; and
   a third module operatively coupled to said pair of second modules, wherein said third module analyzes a value of the first and second output addresses for interleaving based on a predetermined criteria, and wherein said third module determines a validity of said first and second output addresses by analyzing a value of said first and second output addresses to determine invalid data in any of said first and second output addresses.

2. The system of claim 1, wherein said input signal and said nominal input signal is of ten bits.

3. A method for generating an address for interleaving in a wireless communication system, said method comprising:
   receiving an input signal;
   translating an input signal to generate a nominal input signal based on a value of the received input signal;
   estimating a value of said nominal input signal as 159 when said value of said received input signal is 155;
   estimating said value of said nominal input signal as 1023 when said value of said received input signal is 993;
   estimating said value of said nominal input signal for other values of said received input signal using: $I_n = I_r + \text{floor}(I_r/32)$, wherein $I_n$ comprises said value of said nominal input signal, $I_r$ comprises said value of said received input signal, and floor(x) comprises a standard mathematical function that generates a highest integer less than or equal to x;
   receiving said nominal input signal from said first module;
   generating a first and second output address for interleaving based on said nominal input signal;
   analyzing a value of the first and second output addresses for interleaving based on a predetermined criteria; and
   determining a validity of said first and second output addresses by analyzing a value of said first and second output addresses to determine invalid data in any of said first and second output addresses.

4. The method of claim 3, wherein said input signal and said nominal input signal is of ten bits.

5. A non-transitory program storage device readable by computer and comprising a program of instructions executable by said computer to perform a method for generating an address for interleaving in a wireless communication system, said method comprising:
   receiving an input signal;
   translating an input signal to generate a nominal input signal based on a value of the received input signal;
   estimating a value of said nominal input signal as 159 when said value of said received input signal is 155;
   estimating said value of said nominal input signal as 1023 when said value of said received input signal is 993;
   estimating said value of said nominal input signal for other values of said received input signal using: $I_n = I_r + \text{floor}(I_r/32)$, wherein $I_n$ comprises said value of said nominal input signal, $I_r$ comprises said value of said received input signal, and floor(x) comprises a standard mathematical function that generates a highest integer less than or equal to x;
   receiving said nominal input signal from said first module;
   generating a first and second output address for interleaving based on said nominal input signal;
   analyzing a value of the first and second output addresses for interleaving based on a predetermined criteria; and
   determining a validity of said first and second output addresses by analyzing a value of said first and second output addresses to determine invalid data in any of said first and second output addresses.

6. The program storage device of claim 5, wherein said input signal and said nominal input signal is of ten bits.

* * * * *